United States Patent [19]

Nogavich

[11] Patent Number: 4,634,503
[45] Date of Patent: Jan. 6, 1987

[54] IMMERSION ELECTROPLATING SYSTEM
[76] Inventor: Daniel Nogavich, 153 Redfield St., Newbury Park, Calif. 91320
[21] Appl. No.: 625,040
[22] Filed: Jun. 27, 1984
[51] Int. Cl.[4] ............................................. C25D 17/00
[52] U.S. Cl. ..................................... 204/27; 204/14.1; 204/237; 204/275
[58] Field of Search .................... 204/27, 28, 237, 238, 204/239, 275, 276, 14.1

[56] References Cited
U.S. PATENT DOCUMENTS

| | | | |
|---|---|---|---|
| 2,391,039 | 12/1945 | Schaefer | 204/40 |
| 2,545,566 | 3/1951 | Booe | 204/53 |
| 2,673,836 | 3/1954 | Vonada | 204/28 |
| 2,962,427 | 11/1960 | Kosowsky | 204/34 |
| 3,634,047 | 1/1972 | Faulkner | 428/579 |
| 3,649,510 | 3/1972 | Smith et al. | 204/238 |
| 3,682,809 | 8/1972 | Marquardson et al. | 204/275 |
| 4,162,955 | 7/1979 | Schregenberger | 204/299 EC |
| 4,169,780 | 10/1979 | Stiker et al. | 204/206 |
| 4,207,153 | 6/1980 | Flood | 204/106 |
| 4,290,859 | 9/1981 | Oda et al. | 204/16 |

Primary Examiner—John F. Niebling
Assistant Examiner—William T. Leader
Attorney, Agent, or Firm—Lewis Anten; Robert B. Block

[57] ABSTRACT

Method and apparatus for immersion plating using a vat separated by a baffle into a reservoir of plating liquid joined through a port in the baffle and weir to a plating section into which having closely spaced and parallel anode and cathode beneath which a continuously flowing sheet of fluid is upwardly directed to flow into and between the cathode and anode, around all their edges and back through the port and weir to the reservoir. Plating currents of 130 ASF and plating times of under ten minutes have been achieved.

6 Claims, 4 Drawing Figures

IMMERSION ELECTROPLATING SYSTEM

BACKGROUND OF THE INVENTION

This invention relates to a system including method and apparatus for immersion electroplating flat objects and particularly printed circuit boards (PCBs). Most PCBs are flat and represent an opportunity to optimize the electroplating configuration to the specific need of plating flat goods with holes of only limited extent.

There has always existed a general need to perform electroplating of a high-quality, uniform deposit in a minimal amount of time. Recent proposals for high-speed plating of PCBs have developed methods which avoid immersion techniques in favor of spray nozzle designs. The need for abandoning immersion systems has been thought to involve the low-current density limits imposed by such systems and the long cycle times which are required. In non-immersion systems, plating cycle times of as short as ten (10) minutes are known, but were believed impossible to achieve with immersion techniques. By abandoning immersion techniques, the advantages of immersion were also lost. There is, therefore, a need for a new and improved system for electroplating flat goods, particularly PCBs wherein high quality electroplating by immersion can be finished in about ten minutes or less.

SUMMARY OF THE INVENTION AND OBJECTS

In general, it is an object to the present invention to provide an improved immersion plating system having high-current density and a fast process cycle time which is particularly adapted for the plating of flat objects such as PCBs.

A further general object of the invention is to provide an electroplating system of the above character capable of operating up to 200 ASF in an immersion system, and of obtaining plating cycle times of less than ten (10) minutes.

The present invention is based upon the realization that it is not necessary to resort to vapor or spray plating module techniques, as known in the current art, in order to achieve short plating times in satisfactory operation. It has been found that it is possible to employ an immersion technique in which the plating bath is directed upwardly to flow as a rising sheet of liquid between the plates, which are themselves positioned in closely spaced parallel planes, and thereafter the immersion liquid spreads out, traveling as though it were centrally directed into the central region between the plates, from which it flows horizontally around the outer edges and upwardly over the top edge from which it exits back to a reservoir through a port and weir of an adjacent baffle.

The foregoing object is generally achieved by providing a narrow region of generally planar extent into which the anode (plating metal) and cathode (object) can be placed in close proximity to each other. The flow pattern is established as a sheet upwardly flowing between the plates. This is done by a distribution head disposed to fill as it were one edge at the bottom side of a volume defined by anode and the cathode. After the liquid has passed upwardly, an adjacent baffle which defines the plating region rises to a level above the electrodes to form a weir over which the liquid overflows. Also, the baffle is provided with a centrally disposed port or aperture of a size capable of taking a substantial amount of liquid from the plating region which has been passed around the edges of the anode. The port is approximately twice the size of the pump input to the distribution head. However, it has a volume displacement capability somewhat less than the pumped inlet displacement.

These and other objects and the features of the invention will become apparent from the following description and claims when taken in conjunction with the accompanying drawings of which:

BRIEF DESCRIPTION OF THE DRAWINGS

FIG. 4 is a perspective view showing the relationship of the plating racks to the baffle and distribution head in the plating region of the immersion tank of FIG. 1.

DESCRIPTION OF THE PREFERRED EMBODIMENT

Figure 1:
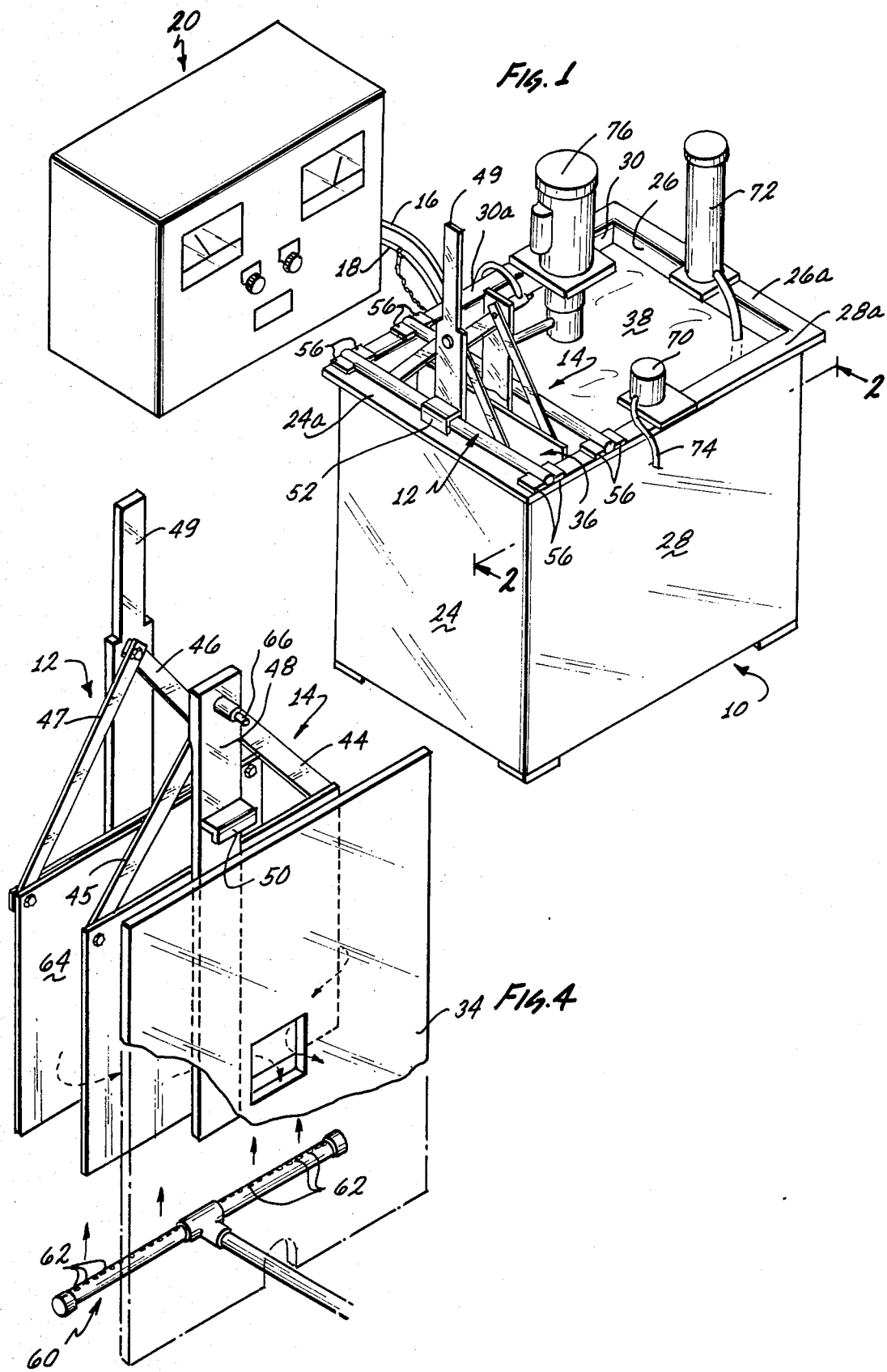
FIG. 1 is a perspective view of a plating system constructed in accordance with the present invention and including an immersion vat and power supply.

Referring now to FIG. 1 there is shown the overall system of the present invention which generally consists of a plating vat 10 carrying the plating electrodes and racks 12, 14 at one side therein which carry the cathode and anode electrodes assemblies connected through suitable electrical cables 16, 18 to a DC current electrical supply 20. The electrical supply 20 may be of a conventional type capable of delivering 9 volts at 500 AMPS.

The plating vat may be of a generally square configuration as shown and consists of a bottom wall 22, side walls 24, 26, and front and back walls 28, 30, all of which may be made of a suitable inert material such a polypropylene plastic, and capped with side rails 24a, 26a, 28a, and 30a, all about to serve as support for the various components to be described. Together, the several walls comprise a tank or vat for containing the electroplating bath. The vat is divided by a baffle 34 (best seen in FIGS. 2 and 3) into a plating region 36 at the left and reservoir 38 at the right.

Figure 2:
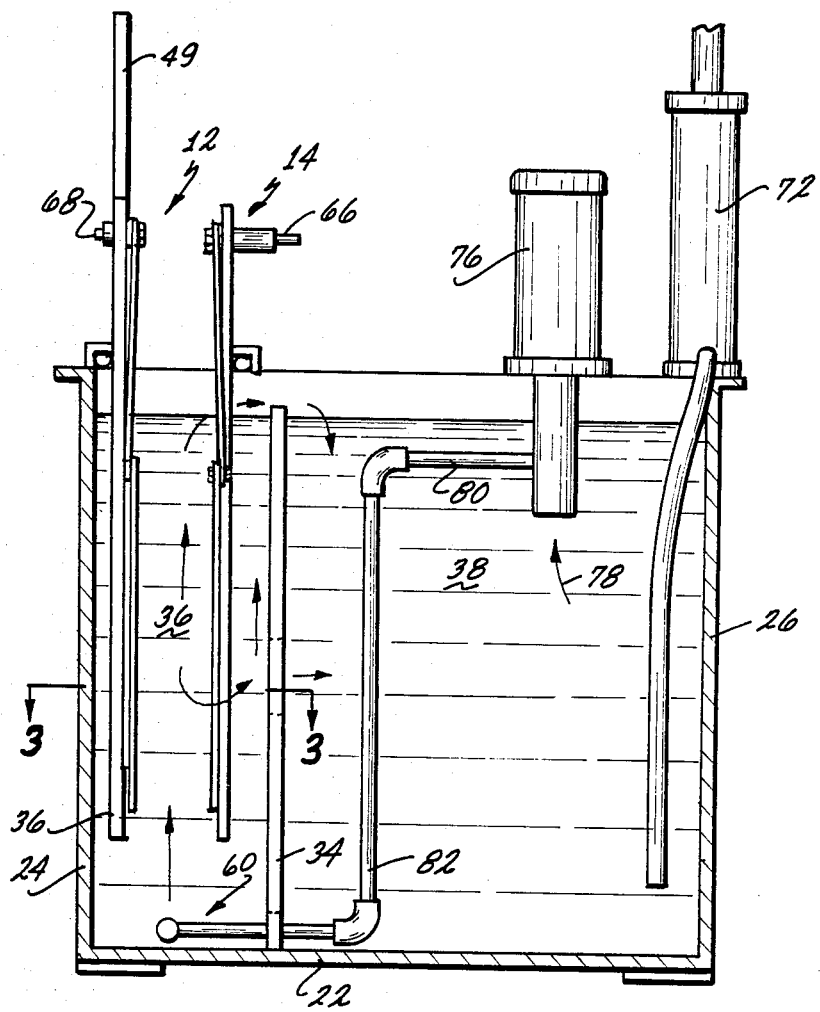
FIG. 2 is a cross-sectional view of the immersion vat taken along the lines 22 of FIG. 1.
Figure 3:
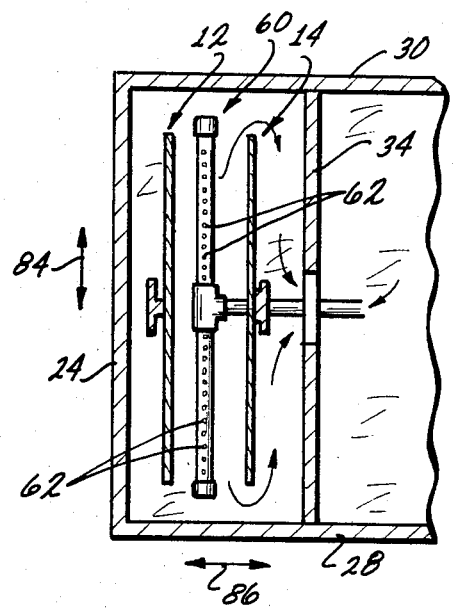
FIG. 3 is a cross-sectional view taken along the lines 33 of FIG. 2.

The cathode and anode assemblies are most clearly shown in FIGS. 2 through 4. Each assembly consists of a subframe 40, 42 including arms 44-47 joined together at a respective vertical brace 48, 49 which mounts brackets 50, 52 which are mounted to and extend horizontally away from each brace. Each bracket is adapted to overlie a bar which rests on the side rails of the vat. Positioning is pre-established by placing fixed spacers 56 on the rails so that the cathode and electrode frames can hang on bars in closely spaced parallel planes. The spacers are so arranged that the space between the anode and the cathode exactly and equally overlies to each side the plating region of the vat between the baffle 34 and wall 24. A distribution head 60 is centrally disposed in the bottom and formed with a plurality of orifices directed upwardly to deliver electrolyte into the mid-region between the anode and the cathode (FIG. 3). The front side or inner side of each of the frames is adapted to removably carry the appropriately electrically conductive element, as for example, a copper anode and PCB cathode. More generally, the cathode carries the plate 64 to be plated which is a flat piece, while the anode carries for example a conductive plate which supplies part of the circuit by which the plating action takes place. The anode and the cathode assemblies are electrically connected through posts 66, 68 to terminals to which cables 16, 18 and associated clamps (not shown) lead to the plating power supply 20.

The simple arrangement described is designed to be symmetrical and allows the electrolyte solution to be pumped upwardly as shown in FIG. 2 to flow evenly through the planar region defined by the opposing plates. As shown in FIG. 3 the distributor tube 60 extends virtually from one side to the other of this region so that the flow is laminar and sheet-like flowing upwardly, and uniformly between the plates. The liquid is taken out of the plating region by flowing it around the edges of the plates preferably over the top and around the sides, the overflow thus created being returned reservoir region 38 through a centrally disposed port in the baffle and by weir overflow over the top of the baffle.

The invention employs two separate pumping systems in the reservoir 38. The first includes a small electric motor driven pump 70 which has an inlet immersed in the bath and an outlet connected to a filter 72 for return to the reservoir. The electrical connection is shown as 74. This is a simple filter.

The second pump system is the main plating fluid supply pump 76 which has an inlet 78 immersed in the bath at propitious level as for example, a few inches below its upper surface, and an outlet 80 connected through suitable piping 82 through an access in the lower part of the baffle and to the distributor head 60.

It has been found that a reservoir 38 capacity of about ten times that of the plating region 36 is satisfactory to keep depletion and necessary recharging at a satisfactory minimum.

The distribution head is simply constructed of a section of plastic pipe having 1/16th inch diameter holes set on one inch centers to form a uniformly distributed row of orifices along the bottom of region 36. The distribution pipe is capped at each end. The pump volume is set for a flow rate of 25 gallons per minute.

The plating section 36 is defined and arranged by the baffle 34 to be much wider (in the direction 84) than deep (in the direction 86) and to accept quite wide anode and cathode structures which are to be positioned very close to each other and in spaced parallel planes to define the working gap between them. This working gap or region is in the form of a vertically and horizontally (84) extensive region having a depth (86) defining a sheet of liquid electrolyte bath passing upwardly between the plates. This sheet is in continuous formation at the bottom and continuous degradation as it flows around the edges and top of the anode.

The electrodes are positioned in proximity to each other at a spacing of less than about two inches and may be spaced as close as one inch. The region between the plates is free of any restrictions or baffles so that the complete flow of plating fluid may pass freely upwardly between them.

In general the present invention has been developed in one form for particular use in the copper plating of PCB's. In that use the invention may employ substantially standard copper fluoborate solution and a copper plate anode.

It has been known to analyze the equipotential surfaces of various geometries used in plating via potential theory. As such, the proposal of the present invention is quite simple and consists of terminated, non-infinite planes which are parallel to each other. However, as a practical matter, there has not been any proposal for the use of parallel plates operated at this spacing because of prejudices and historical reasons which exist in this industry. In the present invention, it is found it is possible to use a small gap of the order of one to two inches and still achieve extremely rapid and high quality plating. It has not been found necessary with the present invention to employ shielding electrodes or thiefs or other secondary modifying elements although the same might be useful for some considerations. In general, a detailed field analysis using potential theory has not been done on the present invention since the results which have been achieved speak for themselves and, as is known, field theory has considerable limitations in view of the failure of most practical systems to adhere closely to the theoretical conditions which are easy to analyze. In that connection reference is made to the Electroplating Engineering Handbook, 2nd Edition, A. Kenneth Graham, E.D., published by Rhineholt Publishing Corp., New York, Chpt. 16 at page 480 where some electropotential considerations are analyzed. At the same time as pointed out by those authors, namely H. L. Pinkerton, that, despite the niceties of the theoretical considerations of the general theory of the potential field, it cannot be applied directly in practical situations where polarization and other factors must be accounted for and cannot.

In the dimensions given, the system and plating cell of the invention works very well and can be expected to scale quite nicely. These dimensions may be summarized as follows.

The distribution tube is 19 inches long with 1/6th inch holes (orifices) set on 1 inch centers.

The spacing of the plates is from ¼ inch to 3 inches. A 1 inch gap was used with a flow rate of 25 gallons per minute and current of 130 ASF in one application.

The plating current has been set from 100–130 ASF with quite satisfactory results in about nine (9) minutes, and may range from 75–400 ASF. Of course, it may be taken to lower values, if desired.

No cathode agitation has been found necessary.

While a copper plating has been given by way of example, other systems will work equally well such as nickel and tin plating solutions.

I claim:

1. A method for immersion electroplating of an object in a plating vat filled with electrolyte comprising:
    forming a plating section and a reservoir section in the vat by disposing a baffle therein,
    pumping electrolyte under pressure into the plating section at the bottom thereof through a linear distribution means disposed along a line at the bottom of the section and parallel to the baffle to thereby generate an upward flowing vertical stream of electrolyte from the distribution means, said electrolyte stream moving along a vertical plane extending from the linear distribution head upwardly through the plating section, while maintaining the vertical plane free of obstructions,
    positioning a cathode electrode between said upward flowing stream and the baffle, and connecting the object to be plated to the cathode,
    positioning an anode electrode on the other side of said of upward flowing stream,
    passing electrolyte from the region of the stream over the entire surface of the object and around all sides thereof by forming an opening in the baffle approximately horizontally even with the middle of the object, through which opening the electrolyte flows to the reservoir section, continuously pumping electrolyte from the reservoir section to the distribution means during plating while simultaneously applying a plating current.

2. The method as in claim 1 further including maintaining a plating current of at least 130 ASF for a time sufficient to plate the object.

3. Immersion electroplating apparatus comprising a plating vat, means forming a vertical baffle in said plating vat to form a plating section on one side thereof and a reservoir section on the other side thereof, means forming an opening in said baffle for flow of electrolyte from the plating section to the reservoir section, means forming a linear distribution means at the bottom of the plating section and parallel to the baffle so as to create an upward flowing vertically moving stream of fluid from the distribution means and through the plating section, means forming a cathode electrode adapted to support the object to be electroplated and mounted in a position between the upward flowing sheet of electrolyte and the baffle, means forming an anode electrode on the other side of said vertically moving sheet of electrolyte, pump means connected to said reservoir and to said distribution means so as to deliver fluid from the reservoir to the distribution means under pressure so that fluid is passed from the distribution means in an upwardly flowing stream impinging over the entire surface of the object to be plated and around the sides thereof all about and thereafter flowing in an exit stream through said opening in the baffle, said opening being approximately horizontally midway in the vertical extent thereof, means forming a plating circuit for delivering a plating current between the anode and cathode electrodes continuously during continuous pumping of electrolyte fluid through said distribution means.

4. Apparatus as in claim 3 in which said electrodes are positioned in proximity and facing each other at a spacing of about less than two inches, said plating section being free of restriction in all directions and between said electrodes.

5. An immersion apparatus for electroplating a uniform metallic film on the surface of an object comprising, a plating vat having bottom and side walls, a bath of electrolyte disposed in said vat, means forming a vertical baffle dividing said vat into an electroplating section and a reservoir, a pair of electrodes including an anode and a cathode, each having a generally planar configuration, means for connecting the object to be electroplated as part of said cathode.

means for mounting said anode and cathode in closely spaced parallel and vertical relation to each other and immersed within the bath in said plating section of said vat, said cathode being placed adjacent to and in parallel relation with said baffle, said anode being placed vertically and spaced from said cathode to form a vertically extending volume therebetween, distribution means forming a plurality of orifices for directing the flow of electrolyte upwardly from the bottom of said electroplating section and in vertical alignment through said vertical volume, said orifices being regularly spaced along a line midway between said anode and cathode, pump means for delivering electrolyte from the reservoir into said distribution means under pressure, means forming a return opening in said baffle disposed about at approximately its center so that flow is developed around all sides of the cathode, over the top thereof, and around the sides and bottom thereof with electrolyte passing both through the return opening and over the top of the flow baffle to return to the reservoir, means for delivering an electrical current to said electrodes.

6. Apparatus for electroplating as in claim 5 in which said electrolyte bath is copper fluoborate solution, and wherein said means for delivering electric current between said electrodes is capable of delivering a ninety to two hundered ASF current density therebetween for a period of at least ten minutes, said electrodes being mounted in fixed relation to each other and to the vat without agitation.

* * * * *